US012616075B2

(12) United States Patent (10) Patent No.: US 12,616,075 B2
Kim et al. (45) Date of Patent: Apr. 28, 2026

(54) SEMICONDUCTOR PACKAGE INCLUDING A SEMICONDUCTOR CHIP ON A REDISTRIBUTION SUBSTRATE AND CONDUCTIVE STRUCTURE SPACED APART FROM THE SEMICONDUCTOR CHIP

(71) Applicant: SAMSUNG ELECTRONICS CO., LTD., Suwon-si (KR)

(72) Inventors: Dongkyu Kim, Suwon-si (KR); Joonsung Kim, Suwon-si (KR); Hyeonseok Lee, Suwon-si (KR); Hyeonjeong Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 454 days.

(21) Appl. No.: 18/121,429

(22) Filed: Mar. 14, 2023

(65) Prior Publication Data

US 2024/0038642 A1 Feb. 1, 2024

(30) Foreign Application Priority Data

Jul. 28, 2022 (KR) ......................... 10-2022-0094034

(51) Int. Cl.
*H01L 23/498* (2006.01)
*H01L 23/00* (2006.01)
(Continued)

(52) U.S. Cl.
CPC .... *H01L 23/49811* (2013.01); *H01L 23/3128* (2013.01); *H01L 23/49822* (2013.01);
(Continued)

(58) Field of Classification Search
CPC ............. H01L 25/105; H01L 23/19822; H01L 23/49811; H01L 23/3128; H01L 23/5389;
(Continued)

(56) References Cited

U.S. PATENT DOCUMENTS 9,406,658 B2 8/2016 Lee et al.
9,520,385 B1 12/2016 Chen et al.
(Continued)

FOREIGN PATENT DOCUMENTS

KR 10-2020-0134377 A 12/2020
KR 10-2022-0015193 A 2/2022

*Primary Examiner* — Khiem D Nguyen
(74) *Attorney, Agent, or Firm* — Sughrue Mion, PLLC

(57) ABSTRACT

A semiconductor package includes a first redistribution substrate, a semiconductor chip provided on a top surface of the first redistribution substrate, a conductive structure provided on the top surface of the first redistribution substrate and spaced apart from the semiconductor chip, a molding layer provided on the first redistribution substrate and covering a side surface of the semiconductor chip and a side surface of the conductive structure, and a second redistribution substrate on the molding layer and the conductive structure. The conductive structure includes a first conductive structure provided on the first redistribution substrate, and a second conductive structure provided on a top surface of the first conductive structure. The second redistribution substrate includes an insulating layer. At least a portion of a top surface of the second conductive structure directly contacts the insulating layer of the second redistribution substrate.

19 Claims, 18 Drawing Sheets

(51) Int. Cl.
    *H01L 23/31*         (2006.01)
    *H01L 25/10*         (2006.01)

(52) U.S. Cl.
    CPC ............ *H01L 24/16* (2013.01); *H01L 25/105*
        (2013.01); *H01L 24/32* (2013.01); *H01L 24/73*
        (2013.01); *H01L 2224/16227* (2013.01); *H01L*
        *2224/32225* (2013.01); *H01L 2224/73204*
        (2013.01)

(58) Field of Classification Search
    CPC ....... H01L 23/49822; H01L 2225/1041; H01L
        2224/16227; H01L 2224/32225; H01L
        2224/73204; H01L 2224/81
    See application file for complete search history.

(56)            References Cited

U.S. PATENT DOCUMENTS

| | | | |
|---|---|---|---|
| 9,831,142 B2 | 11/2017 | Back et al. | |
| 10,056,350 B2 | 8/2018 | Lin et al. | |
| 10,504,825 B2 | 12/2019 | Lee et al. | |
| 10,964,591 B2 | 3/2021 | Hsieh et al. | |
| 11,031,375 B2 * | 6/2021 | Lee ................... | H01L 21/76885 |
| 11,101,252 B2 * | 8/2021 | Lin ..................... | H01L 23/5389 |
| 11,296,004 B2 * | 4/2022 | Yoo ........................ | H01L 24/05 |
| 2014/0077364 A1 * | 3/2014 | Marimuthu ........... | H01L 25/105 |
| | | | 257/737 |
| 2018/0315728 A1 * | 11/2018 | Pei .......................... | H01L 24/19 |
| 2019/0385989 A1 * | 12/2019 | Yu ....................... | H01L 23/5386 |
| 2020/0273804 A1 * | 8/2020 | Jeon ........................ | H01L 24/20 |
| 2022/0013454 A1 | 1/2022 | Kang et al. | |

* cited by examiner

330u

400u

320u

330

310u 310
160
150
155
101

101u

D2

D1

1

790
740
730
750
702
700 705
701
650
655
600 601
630
635
400
330
300 320
310
160
150
155
100 130
135
101
100b
120

720

800

200

30

10

500    250 230    410

D2
D1

929
920
310Z
160
150
155Z
130
135
101
120
900

D2
D1

929
330
320
920
310Z
160
150
155Z
130
135
101
120
900
330u
320u

D2
D1

SEMICONDUCTOR PACKAGE INCLUDING A SEMICONDUCTOR CHIP ON A REDISTRIBUTION SUBSTRATE AND CONDUCTIVE STRUCTURE SPACED APART FROM THE SEMICONDUCTOR CHIP

CROSS-REFERENCE TO RELATED APPLICATIONS

This application claims priority to Korean Patent Application No. 10-2022-0094034, filed on Jul. 28, 2022, in the Korean Intellectual Property Office, the disclosure of which is incorporated by reference herein in its entirety.

BACKGROUND

The present disclosure relates to a semiconductor package, and more particularly, to a semiconductor package including a redistribution substrate and a method of manufacturing the same.

An integrated circuit chip may be implemented as a semiconductor package that can be applied to an electronic product. A semiconductor chip may be mounted on a printed circuit board and may be electrically connected to the printed circuit board through bonding wires or bumps. Various techniques for reliability improvement, high integration density and miniaturization of semiconductor packages have been studied with the development of the electronic industry.

SUMMARY

One or more embodiments provide a semiconductor package which may have improved durability and reliability.

In addition, one or more embodiments provide a method of manufacturing a semiconductor package which may be capable of improving efficiency and of simplifying processes.

According to an aspect of an example embodiment, a semiconductor package includes: a first redistribution substrate; a semiconductor chip provided on a top surface of the first redistribution substrate; a conductive structure provided on the top surface of the first redistribution substrate and spaced apart from the semiconductor chip; a molding layer provided on the first redistribution substrate and covering a side surface of the semiconductor chip and a side surface of the conductive structure; and a second redistribution substrate provided on the molding layer and the conductive structure, wherein the conductive structure includes a first conductive structure provided on the first redistribution substrate, and a second conductive structure provided on a top surface of the first conductive structure, wherein the second redistribution substrate includes an insulating layer, and wherein at least a portion of a top surface of the second conductive structure directly contacts the insulating layer of the second redistribution substrate.

According to an aspect of an example embodiment, a semiconductor package includes: a first redistribution substrate; a semiconductor chip provided on a top surface of the first redistribution substrate; a conductive structure provided on the top surface of the first redistribution substrate and spaced apart from the semiconductor chip; a molding layer provided on the first redistribution substrate and covering a side surface of the semiconductor chip and a side surface of the conductive structure; and a second redistribution substrate provided on the molding layer and the conductive structure and connected to the conductive structure, wherein the conductive structure includes: a first conductive structure connected to the first redistribution substrate; and a second conductive structure provided on the first conductive structure, wherein a top surface of the second conductive structure coplanar with a top surface of the molding layer.

According to an aspect of an example embodiment, a semiconductor package includes: a first redistribution substrate including a first insulating layer and a first redistribution pattern; a solder ball provided on a bottom surface of the first redistribution substrate; a semiconductor chip provided on a top surface of the first redistribution substrate; a conductive structure on the first redistribution substrate and laterally spaced apart from the semiconductor chip; a seed pattern disposed between the first redistribution substrate and the conductive structure; a molding layer provided on the first redistribution substrate and covering the semiconductor chip, the molding layer covering a side surface of the conductive structure and exposing a top surface of the conductive structure; and a second redistribution substrate provided on the molding layer and connected to the conductive structure, wherein the second redistribution substrate includes a second insulating layer and a second redistribution pattern, wherein the conductive structure includes: a first conductive structure provided on the top surface of the first redistribution substrate, and a second conductive structure covering a top surface of the first conductive structure, wherein the second insulating layer includes a photosensitive polymer, wherein the second conductive structure includes nickel (Ni), and wherein the second insulating layer directly contacts at least a portion of a top surface of the second conductive structure.

BRIEF DESCRIPTION OF THE DRAWINGS

The above and other aspects and features will be more apparent from the following description of example embodiments, taken in conjunction with the accompanying drawings, in which.

DETAILED DESCRIPTION

Figure 1:
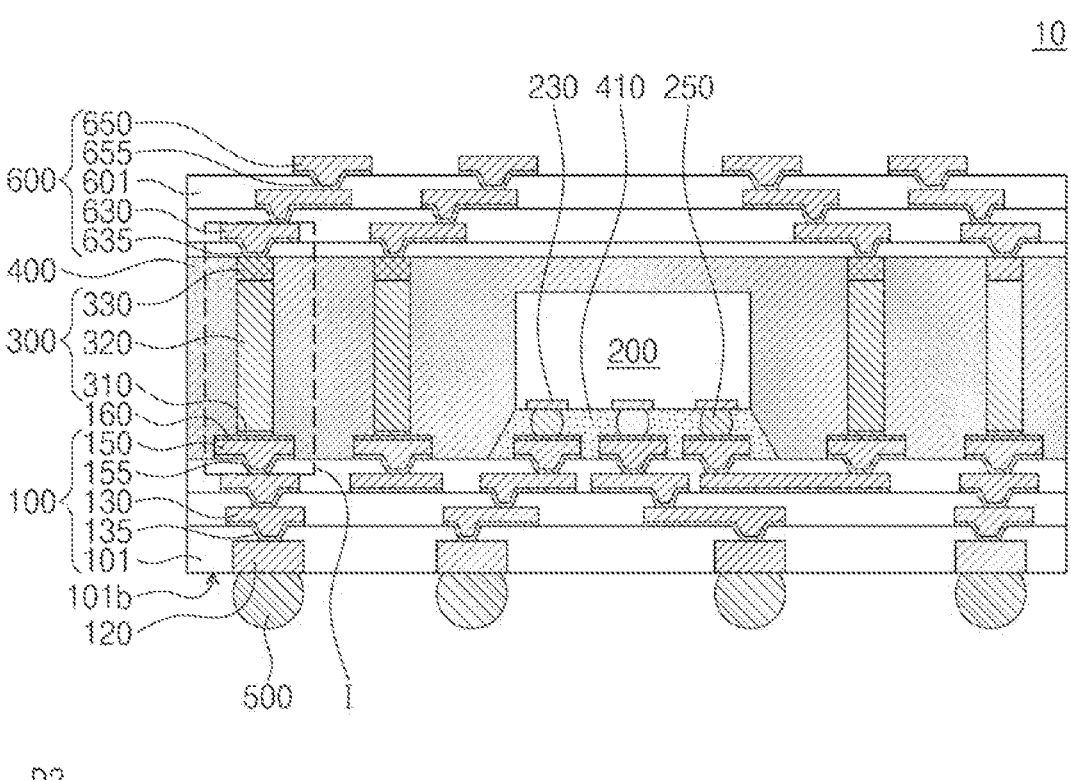
FIG. 1 is a cross-sectional view illustrating a semiconductor package according to example embodiments.

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. The same reference numerals or the same reference designators may denote the same elements or components throughout the specification.

Figure 2:
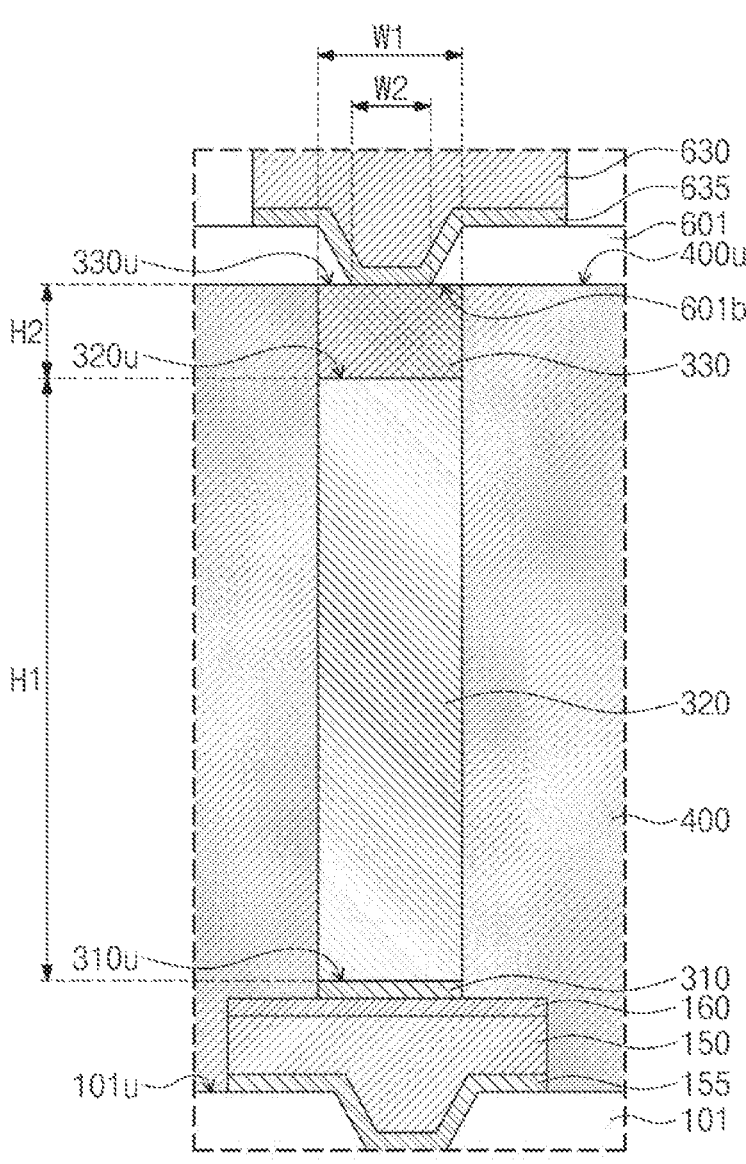
FIG. 2 is an enlarged view of a region 'I' of FIG. 1.
Figure 2:
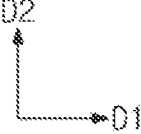

FIG. 1 is a cross-sectional view illustrating a semiconductor package according to example embodiments. FIG. 2 is an enlarged view of a region 'I' of FIG. 1.

Referring to FIGS. 1 and 2, a semiconductor package 10 may include a first redistribution substrate 100, a semiconductor chip 200, conductive structures 300, a molding layer 400, solder balls 500, and a second redistribution substrate 600. In some example embodiments, the semiconductor package 10 may correspond to a lower package.

The first redistribution substrate 100 may include a first insulating layer 101, under bump patterns 120, first redistribution patterns 130, first seed patterns 135, first seed pads 155, and first redistribution pads 150. The first insulating layer 101 may include, for example, an organic material such as a photo-imageable dielectric (PID) material. The PID material may be a photosensitive polymer. For example, the PID material may include at least one of photosensitive polyimide, polybenzoxazole, a phenol-based polymer, or a benzocyclobutene-based polymer. The first insulating layer 101 may be provided in plurality. The number of the first insulating layers 101 stacked sequentially in an example embodiment is not limited and may be any number, such as one, two, three, four or more. The plurality of first insulating layers 101 may each include the same material or, in example embodiments, may include different materials such that some of the plurality of insulation layers 101 include different materials than others. An interface between the first insulating layers 101 adjacent to each other may be concealed so that it is not visible or observed.

The under bump patterns 120 may be provided in a lowermost one of the first insulating layers 101. Bottom surfaces of the under bump patterns 120 may be left exposed by the lowermost first insulating layer 101 so that they are not covered by the lowermost first insulating layer 101. The under bump patterns 120 may function as pads of the solder balls 500. The under bump patterns 120 may be laterally spaced apart from each other and may be electrically insulated from each other. It may be understood that when two components are referred to as being laterally spaced apart from each other, they may be spaced apart from each other in a first direction D1 parallel to a bottom surface of the first redistribution substrate 100. The term 'lateral or horizontal' used herein may mean 'parallel to the first direction D1'. The bottom surface of the first redistribution substrate 100 may include a bottom surface 101b of the lowermost first insulating layer 101 and the bottom surfaces of the under bump patterns 120. The under bump patterns 120 may include a metal material (e.g., copper).

The first redistribution patterns 130 may be provided on the under bump patterns 120 and may be electrically connected to the under bump patterns 120. The first redistribution patterns 130 may be laterally spaced apart from each other and may be electrically separated from each other. The first redistribution patterns 130 may include a metal (e.g., copper). It may be understood that when a component is referred to as being electrically connected to the first redistribution substrate 100, it may be electrically connected to one of the first redistribution patterns 130. It may be understood that when two components are referred to as being electrically connected to each other, they may be connected directly to each other or may be connected indirectly to each other through another component.

Each of the first redistribution patterns 130 may include a first via portion and a first interconnection portion. The first via portion may be provided in a corresponding one of the first insulating layers 101. The first interconnection portion may be provided on the first via portion and may be connected to the first via portion without an interface therebetween. A width of the first interconnection portion may be greater than a width of the first via portion. The first interconnection portion may extend onto a top surface of the corresponding first insulating layer 101. In the present specification, the term 'via' may mean a component for vertical connection, and the term 'interconnection' may mean a component for horizontal connection. The term 'vertical' may mean 'vertical to the bottom surface of the first redistribution substrate 100'. In other words, the term 'vertical' may mean 'parallel to a second direction D2 and perpendicular to the bottom surface of the first redistribution substrate 100'.

The first redistribution patterns 130 may include a lower redistribution pattern and an upper redistribution pattern, which are sequentially stacked. The lower redistribution pattern may be disposed on a corresponding under bump pattern 120. The upper redistribution pattern may be disposed on the lower redistribution pattern and may be connected to the lower redistribution pattern. The number of the first redistribution patterns 130 stacked between the under bump patterns 120 and the first redistribution pads 150 is not limited to the example embodiment shown FIG. 1 but may be any number in example embodiments.

The first seed patterns 135 may be disposed on bottom surfaces of the first redistribution patterns 130, respectively. For example, each of the first seed patterns 135 may cover a bottom surface and a side surface of the first via portion and a bottom surface of the first interconnection portion of a corresponding one of the first redistribution patterns 130. In an example embodiment, each of the first seed patterns 135 may not extend onto a side surface of the first interconnection portion of the corresponding first redistribution pattern 130. The first seed patterns 135 may include a different material than the under bump patterns 120 and the first redistribution patterns 130. For example, the first seed patterns 135 may include a conductive seed material. The conductive seed material may include copper, titanium, and/or an alloy thereof. The first seed patterns 135 may function as barrier layers to prevent diffusion of a material included in the first redistribution patterns 130.

The first redistribution pads 150 may be disposed on the first redistribution patterns 130 and may be connected to the first redistribution patterns 130. The first redistribution pads 150 may be laterally spaced apart from each other. Each of the first redistribution pads 150 may be connected to a corresponding under bump pattern 120 through the lower redistribution pattern and the upper redistribution pattern. Since the first redistribution patterns 130 are provided, at least one of the first redistribution pads 150 may be offset in the direction D1 so as to be not vertically aligned with the under bump pattern 120 electrically connected thereto. Thus, in an example embodiment, an arrangement of the first redistribution pads 150 may be more freely designed.

The first redistribution pads 150 may be provided in an uppermost one of the first insulating layers 101 and may extend onto a top surface of the uppermost first insulating layer 101. The first seed pads 155 may be provided on bottom surfaces of the first redistribution pads 150, respectively. As illustrated in FIG. 1, the first seed pads 155 may be provided between the upper redistribution patterns of the first redistribution patterns 130 and the first redistribution pads 150, respectively, and may extend between the uppermost first insulating layer 101 and the first redistribution pads 150. The first seed pads 155 may include a different material than the first redistribution pads 150. The first seed pads 155 may include, for example, a conductive seed material.

The semiconductor package 10 may further include bonding pads 160. The bonding pads 160 may be provided on the first redistribution pads 150. The bonding pads 160 may be provided on top surfaces of the first redistribution pads 150 to cover the top surfaces of the first redistribution pads 150. The bonding pads 160 may be laterally spaced apart from each other. Each of the bonding pads 160 may be connected to a corresponding under bump pattern 120 through a corresponding first redistribution pad 150 and corresponding first redistribution patterns 130. The bonding pads 160 may include, for example, gold (Au).

The solder balls 500 may be disposed on the bottom surface of the first redistribution substrate 100. For example, the solder balls 500 may be disposed on the bottom surfaces of the under bump patterns 120 so as to be connected to the under bump patterns 120, respectively. The solder balls 500 may be electrically connected to the first redistribution patterns 130 through the under bump patterns 120. The solder balls 500 may be electrically separated from each other. The solder balls 500 may include a solder material. For example, the solder material may include tin, bismuth, lead, silver, or an alloy thereof. The solder balls 500 may include a signal solder ball, a ground solder ball, and a power solder ball.

The semiconductor chip 200 may be mounted on a top surface of the first redistribution substrate 100. The semiconductor chip 200 may be disposed on a center region of the first redistribution substrate 100 when viewed in a plan view. The semiconductor chip 200 may be, for example, a logic chip, a buffer chip, or a memory chip. For example, the semiconductor chip 200 may be the logic chip. The semiconductor chip 200 may include an ASIC chip or an application processor (AP) chip. The ASIC chip may include an application specific integrated circuit (ASIC). The semiconductor chip 200 may include a central processing unit (CPU) or a graphic processing unit (GPU).

The semiconductor chip 200 may have a top surface and a bottom surface, which are opposite to each other. The bottom surface of the semiconductor chip 200 may face the first redistribution substrate 100 and may be an active surface. The top surface of the semiconductor chip 200 may be an inactive surface. For example, the semiconductor chip 200 may include a semiconductor substrate, integrated circuits, and chip pads 230. The semiconductor substrate may include silicon, germanium, and/or silicon-germanium. The semiconductor substrate may be a silicon wafer. The integrated circuits may be adjacent to the bottom surface of the semiconductor chip 200. The chip pads 230 may be connected to the integrated circuits. It may be understood that when a component is referred to as being electrically connected to the semiconductor chip 200, it may be electrically connected to the integrated circuits of the semiconductor chip 200 through the chip pads 230 of the semiconductor chip 200.

The semiconductor package 10 may further include bumps 250. The bumps 250 may be disposed between the first redistribution substrate 100 and the semiconductor chip 200. For example, the bumps 250 may be provided between corresponding first redistribution pads 150 and the chip pads 230 so as to be connected to the corresponding first redistribution pads 150 and the chip pads 230. Thus, the semiconductor chip 200 may be connected to the first redistribution substrate 100 through the bumps 250. The bumps 250 may include solder balls. The bumps 250 may include a solder material. The bumps 250 may include pillar patterns, and the pillar patterns may include a metal such as copper.

The semiconductor package 10 may include an underfill layer 410. The underfill layer 410 may be provided in a gap region between the first redistribution substrate 100 and the semiconductor chip 200 to cover side surfaces of the bumps 250. The underfill layer 410 may include an insulating polymer such as an epoxy polymer.

The conductive structures 300 may be disposed on the top surface of the first redistribution substrate 100. The conductive structures 300 may be disposed on an edge region of the first redistribution substrate 100 when viewed in a plan view. The edge region of the first redistribution substrate 100 may be provided between the center region of the first redistribution substrate 100 and a side surface of the first redistribution substrate 100 when viewed in a plan view. The edge region of the first redistribution substrate 100 may surround the center region when viewed in a plan view.

The conductive structures 300 may be laterally spaced apart from the semiconductor chip 200. The conductive structures 300 may be laterally spaced apart from each other. The conductive structures 300 may be disposed on corresponding ones of the first redistribution pads 150, respectively, and may be connected to the corresponding first redistribution pads 150, respectively. Thus, the conductive structures 300 may be connected to the first redistribution substrate 100. The conductive structures 300 may be electrically connected to the solder balls 500 and/or the semiconductor chip 200 through the first redistribution substrate 100. Each of the conductive structures 300 may have a first width W1 in the first direction D1.

Each of the conductive structures 300 may include a seed pattern 310, a first conductive structure 320, and a second conductive structure 330. There may be a plurality of the first conductive structures 320 laterally spaced apart from each other, and a plurality of the second conductive structures 330 laterally spaced apart from each other.

The first conductive structure 320 may be disposed on a corresponding first redistribution pad 150 so as to be connected to the corresponding first redistribution pad 150. The first conductive structure 320 may be electrically connected to one of the solder balls 500 or the semiconductor chip 200 through the first redistribution substrate 100. The first conductive structure 320 may be a metal post having a substantially circular pillar shape. For example, a top surface 320u of the first conductive structure 320 may be flat. Also, for example, the first conductive structure 320 may include a metal such as copper (Cu). A width of the first conductive structure 320 of the conductive structure 300 in the first direction D1 may be substantially equal to the first width W1 of the conductive structure 300. The first conductive structure 320 may have a first height H1 in the second direction D2 perpendicular to the top surface of the first redistribution substrate 100.

The second conductive structure 330 may be disposed on the first conductive structure 320 and may be electrically connected to the first conductive structure 320. A bottom surface of the second conductive structure 330 may be in direct contact with the top surface 320u of the first conductive structure 320. The second conductive structure 330 may cover the top surface 320u of the first conductive structure 320. The second conductive structure 330 may have a second height H2 in the second direction D2. The second height H2 may be less than the first height H1. In example embodiments, the second height H2 may range from 10 μm to 30 μm. A width of the second conductive structure 330 in the first direction D1 may be substantially equal to the first width W1 of the conductive structure 300. The second conductive structure 330 may include a material different from that of the first conductive structure 320. The second conductive structure 330 may include nickel (Ni).

The seed pattern 310 may be disposed between the first redistribution substrate 100 and the first conductive structure 320 and may be connected to the first conductive structure 320 and the first redistribution pad 150. A width of the seed pattern 310 in the first direction D1 may be substantially equal to the first width W1 of the conductive structure 300. The seed pattern 310 may include a different material than the first redistribution pad 150 and the first conductive structure 320. For example, the seed pattern 310 may include a conductive seed material.

The molding layer 400 may be provided on the top surface of the first redistribution substrate 100 to cover the top surface and a side surface of the semiconductor chip 200 and side surfaces of the conductive structures 300. A top surface 400u of the molding layer 400 may be aligned with top surfaces of the conductive structures 300 (i.e., top surfaces 330u of the second conductive structures 330) in the first direction D1. The top surfaces 330u of the second conductive structures 330 may be coplanar with the top surface 400u of the molding layer 400. For example, the top surface 400u of the molding layer 400 may be located at substantially the same level as the top surfaces 330u of the second conductive structures 330. The molding layer 400 may include an insulating polymer such as an epoxy molding compound (EMC). The molding layer 400 may include an insulating polymer different from that of the underfill layer 410. In example embodiments, the underfill layer 410 may be omitted, and the molding layer 400 may further extend into the gap region between the first redistribution substrate 100 and the semiconductor chip 200.

The second redistribution substrate 600 may be disposed on the molding layer 400 and the conductive structures 300 and may be electrically connected to the conductive structures 300. For example, the second redistribution substrate 600 may be disposed on the semiconductor chip 200 and may be spaced apart from the top surface of the semiconductor chip 200. The molding layer 400 may fill a gap between the top surface of the semiconductor chip 200 and the second redistribution substrate 600.

The second redistribution substrate 600 may include a second insulating layer 601, second redistribution patterns 630, second seed patterns 635, and second redistribution pads 650. The second insulating layer 601 may include a plurality of second insulating layers 601. The plurality of second insulating layers 601 may be stacked on the molding layer 400. Each of the second insulating layers 601 may include a photo-imageable dielectric (PID) material. In example embodiments, the second insulating layers 601 may all include the same material or some may include different materials than others. An interface between the second insulating layers 601 adjacent to each other may not be visible or observed. The number of the second insulating layers 601 may be variously changed.

The second redistribution patterns 630 may be provided on the conductive structures 300. The second redistribution patterns 630 may be laterally spaced apart from each other and may be electrically separated from each other. Each of the second redistribution patterns 630 may include a second via portion and a second interconnection portion. The second via portion may be provided in a corresponding one of the second insulating layers 601. The second via portion of each of lowermost second redistribution patterns 630 may be provided on the top surface 330u of a corresponding second conductive structure 330. The second interconnection portion may be provided on the second via portion and may be connected to the second via portion without an interface therebetween. The second interconnection portion of each of the second redistribution patterns 630 may extend onto a top surface of a corresponding second insulating layer 601. The second redistribution patterns 630 may include a metal such as copper.

The second seed patterns 635 may be disposed on bottom surfaces of the second redistribution patterns 630, respectively. For example, each of the second seed patterns 635 may be provided on a bottom surface and a side surface of the second via portion of a corresponding second redistribution pattern 630 and may extend onto a bottom surface of the second interconnection portion of the corresponding second redistribution pattern 630. Each of the second seed patterns 635 may include a different material than the conductive structures 300 and the second redistribution patterns 630. For example, the second seed patterns 635 may include a conductive seed material. The second seed patterns 635 may function as barrier layers to prevent diffusion of a material included in the second redistribution patterns 630.

Each of the second redistribution pads 650 may be disposed on a corresponding second redistribution pattern 630 and may be connected to the corresponding second redistribution pattern 630. The second redistribution pads 650 may be laterally spaced apart from each other. Since the second redistribution patterns 630 are provided, at least one of the second redistribution pads 650 may be offset from the conductive structure 300 in the direction D1 to which it is electrically connected and so not be vertically aligned with the conductive structure 300 electrically connected thereto. Thus, according to example embodiments the arrangement of the second redistribution pads 650 may be freely designed.

A lower portion of each of the second redistribution pads 650 may be provided in an uppermost second insulating layer 601. An upper portion of each of the second redistribution pads 650 may extend onto a top surface of the uppermost second insulating layer 601. For example, the second redistribution pads 650 may include a metal such as copper.

The second redistribution substrate 600 may further include second seed pads 655. The second seed pads 655 may be disposed between uppermost second redistribution patterns 630 and the second redistribution pads 650, respectively. The second seed pads 655 may include a conductive seed material.

Hereinafter, the conductive structures 300 will be described in more detail with reference to FIG. 2. A single conductive structure 300 will be described for the purpose of ease and convenience in explanation. At least a portion of the top surface 330*u* of the second conductive structure 330 may be in direct contact with a bottom surface 601*b* of the second insulating layer 601. The top surface 320*u* of the first conductive structure 320 may be spaced apart from the second insulating layer 601 and not be in contact with the second insulating layer 601. A portion of the second seed pattern 635 may be in contact with the top surface 330*u* of the second conductive structure 330. A portion of the top surface 330*u* of the second conductive structure 330, which is in contact with the second seed pattern 635, may have a second width W2 in the first direction D1. The second width W2 may be less than the first width W1 of the conductive structure 300. The seed pattern 310, the first conductive structure 320 and the second conductive structure 330 may overlap with each other when viewed in a plan view, such as when viewed in a plan view from the direction D2. The molding layer 400 may expose the top surface 330*u* of the second conductive structure 330.

Since the top surfaces 320*u* of the first conductive structures 320 are covered with the second conductive structures 330, the first conductive structures 320 may be spaced apart from and not in contact with the second insulating layer 601, and thus reaction between the second insulating layer 601 and the first conductive structures 320 may be prevented. In addition, it is possible to prevent a crack from occurring at connection portions of the second redistribution substrate 600 and the conductive structures 300. Thus, durability and reliability of the conductive structures 300 may be improved. As a result, an example embodiment of the semiconductor package 10 with improved durability and reliability may be provided.

Figure 3:
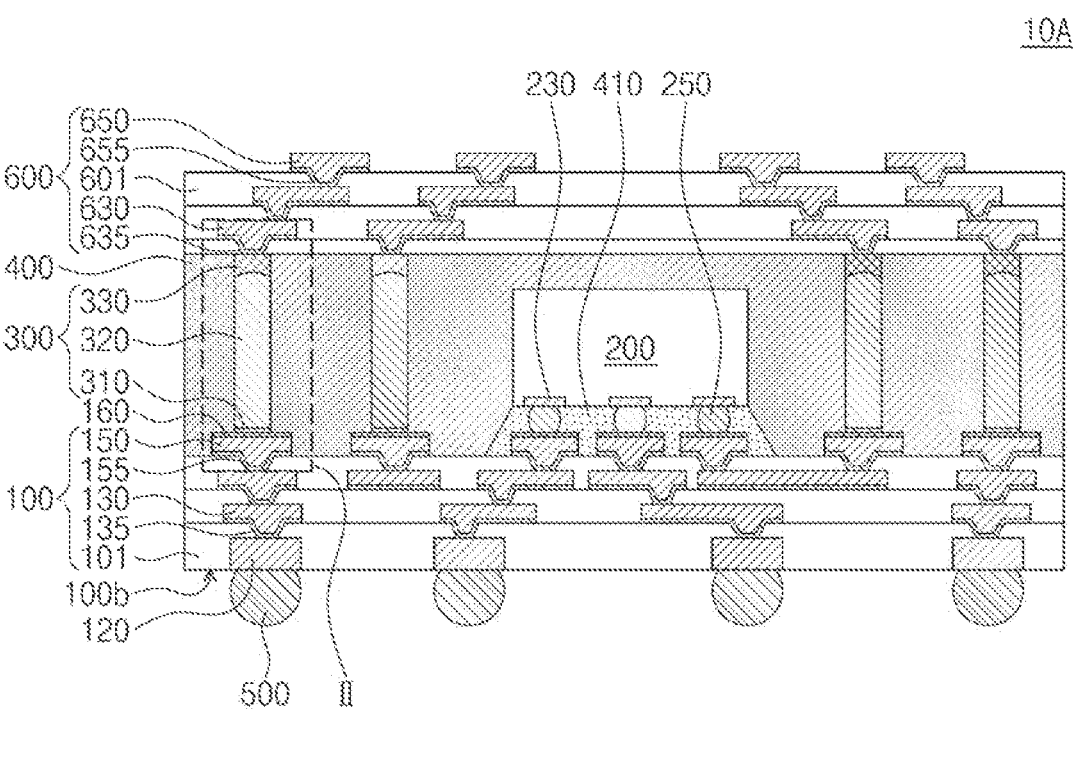
FIG. 3 is a cross-sectional view illustrating a semiconductor package according to example embodiments.
Figure 3:
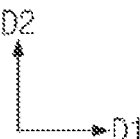
Figure 4:
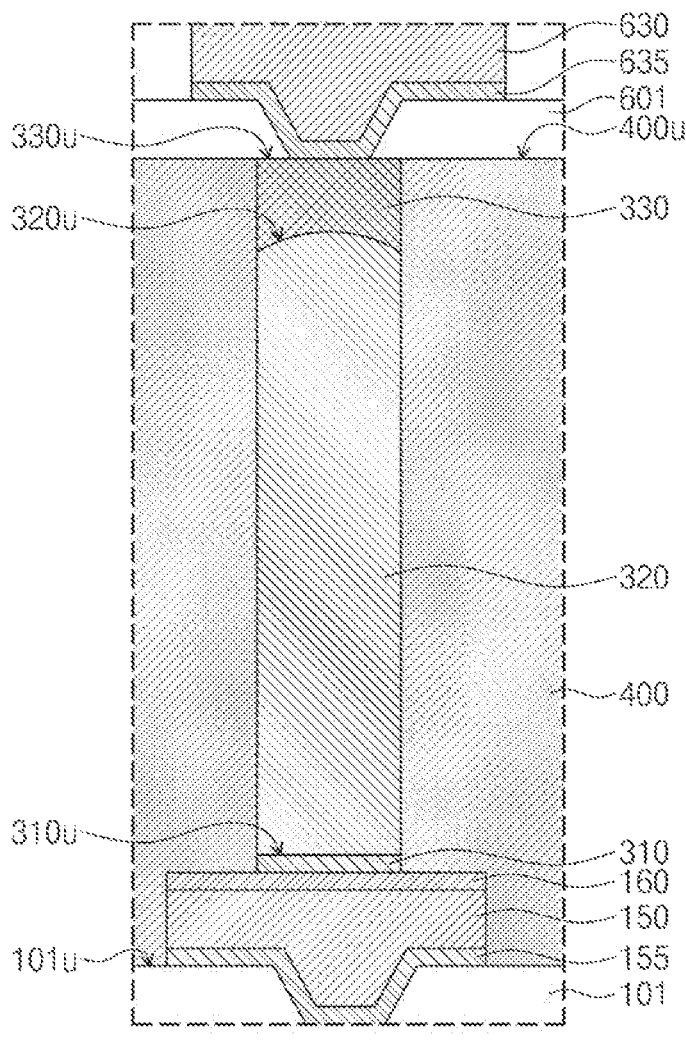
FIG. 4 is an enlarged view of a region 'II' of FIG. 3.
Figure 4:
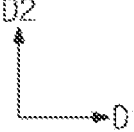

FIG. 3 is a cross-sectional view illustrating a semiconductor package according to example embodiments. FIG. 4 is an enlarged view of a region 'II' of FIG. 3. Hereinafter, the descriptions to the same technical features as mentioned above with reference to FIGS. 1 and 2 will be omitted and differences between the present example embodiments and the above example embodiments of FIGS. 1 and 2 will be mainly described, for the purpose of ease and convenience in explanation. The same or similar components as in the above example embodiments may be indicated by the same reference numerals or designators.

Referring to FIGS. 3 and 4, a semiconductor package 10A may include the first redistribution substrate 100, the semiconductor chip 200, the conductive structures 300, the molding layer 400, the solder balls 500, and the second redistribution substrate 600. The semiconductor package 10A may be a lower package.

A top surface 320*u* of the first conductive structure 320 may be convex with respect to the top surface of the first redistribution substrate 100. In other words, a height of the first conductive structure 320 in the second direction D2 may increase toward a center of the first conductive structure 320. The second conductive structure 330 may cover the convex top surface 320*u* of the first conductive structure 320.

Figure 5:
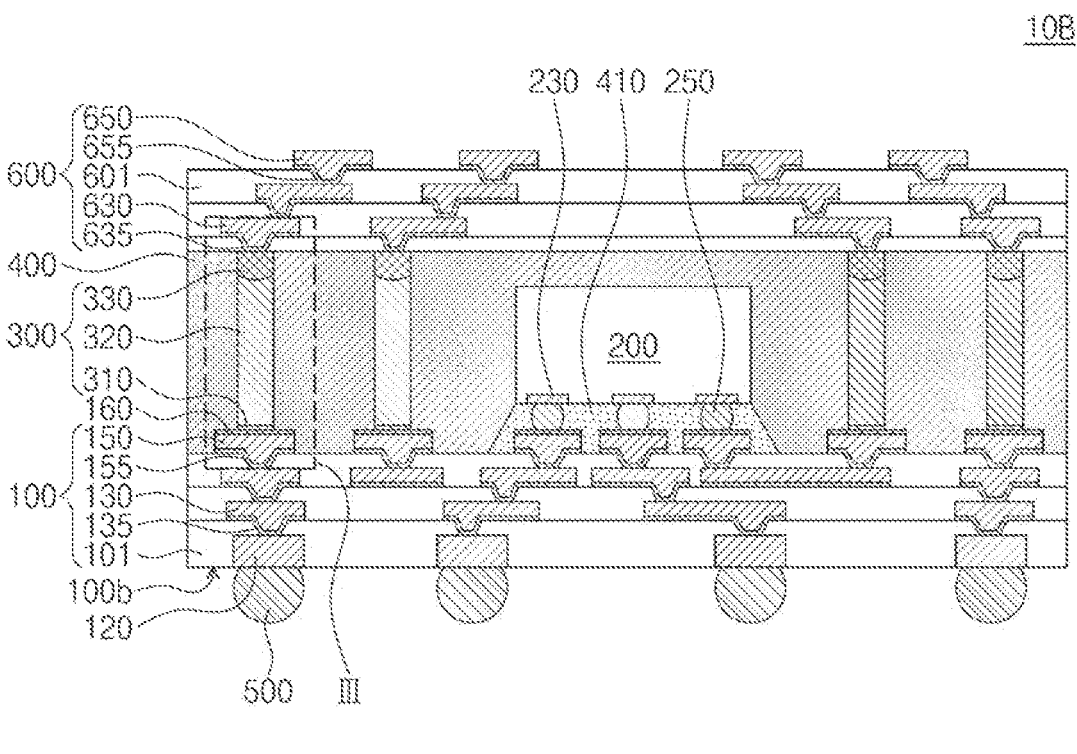
FIG. 5 is a cross-sectional view illustrating a semiconductor package according to example embodiments.
Figure 6:
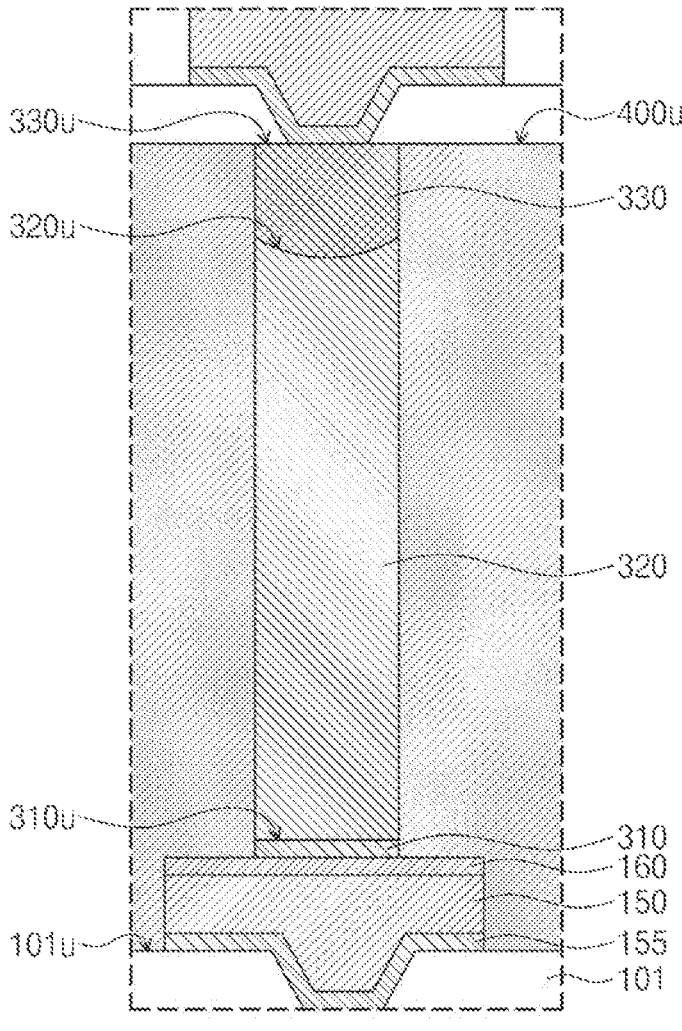
FIG. 6 is an enlarged view of a region 'III' of FIG. 5.
Figure 6:
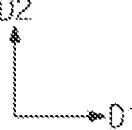

FIG. 5 is a cross-sectional view illustrating a semiconductor package according to example embodiments. FIG. 6 is an enlarged view of a region 'III' of FIG. 5. Hereinafter, the descriptions to the same technical features as mentioned above with reference to FIGS. 1 and 2 will be omitted and differences between the present example embodiments and the above example embodiments of FIGS. 1 and 2 will be mainly described, for the purpose of ease and convenience in explanation. The same or similar components as in the above example embodiments may be indicated by the same reference numerals or designators.

Referring to FIGS. 5 and 6, a semiconductor package 10B may include the first redistribution substrate 100, the semiconductor chip 200, the conductive structures 300, the molding layer 400, the solder balls 500, and the second redistribution substrate 600. The semiconductor package 10B may be a lower package.

A top surface 320*u* of the first conductive structure 320 may be concave with respect to the top surface of the first redistribution substrate 100. In other words, a height of the first conductive structure 320 in the second direction D2 may decrease toward a center of the first conductive structure 320. The second conductive structure 330 may cover the concave top surface 320*u* of the first conductive structure 320.

Figure 7:
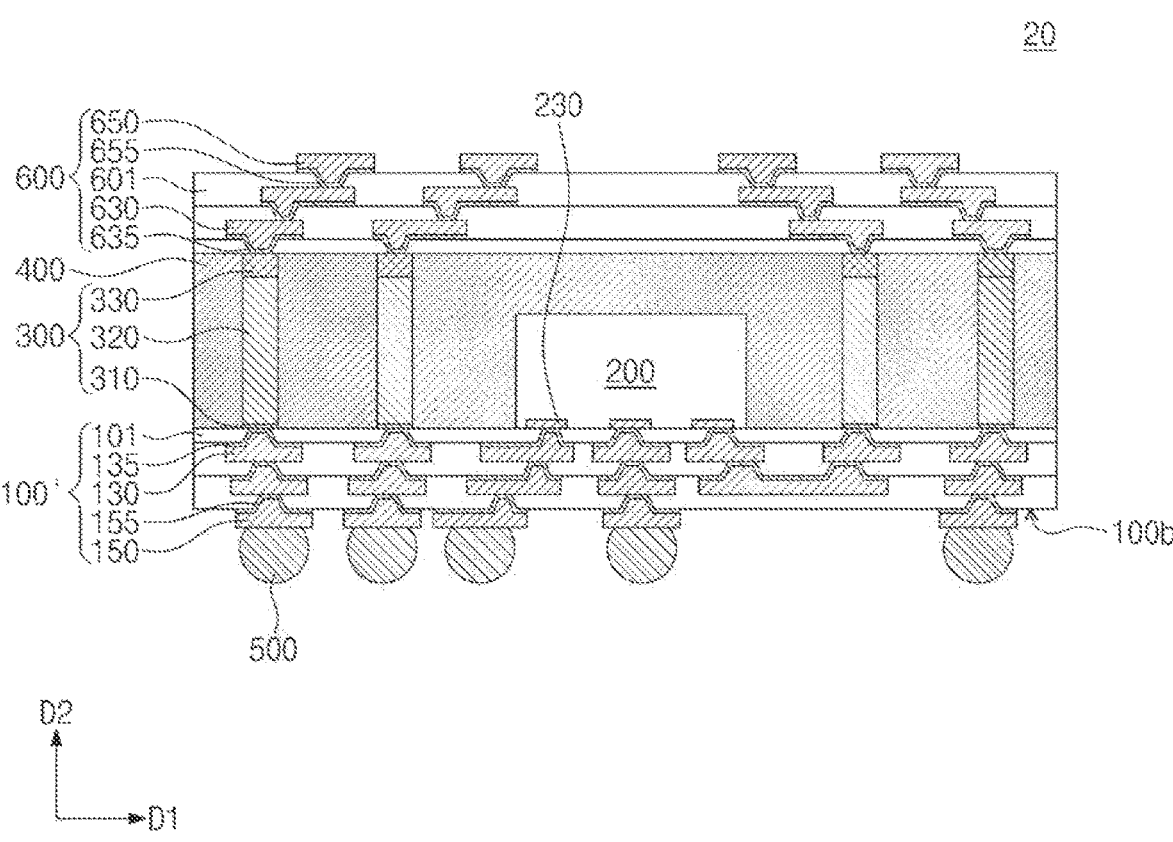
FIG. 7 is a cross-sectional view illustrating a semiconductor package according to example embodiments.

FIG. 7 is a cross-sectional view illustrating a semiconductor package according to example embodiments. Hereinafter, the descriptions to the same technical features as mentioned above with reference to FIGS. 1 and 2 will be omitted and differences between the present example embodiments and the above example embodiments of FIGS. 1 and 2 will be mainly described, for the purpose of ease and convenience in explanation. The same or similar components as in the above example embodiments may be indicated by the same reference numerals or designators.

Referring to FIG. 7, a semiconductor package 20 may include a first redistribution substrate 100', the solder balls 500, the semiconductor chip 200, the conductive structures 300, the molding layer 400, and the second redistribution substrate 600. However, the semiconductor package 20 may not include the bumps 250 and the underfill layer 410, described with reference to FIGS. 1 and 2. The semiconductor package 20 may be a lower package.

The first redistribution substrate 100' may include first insulating layers 101, first redistribution patterns 130, first seed patterns 135, first seed pads 155, and first redistribution pads 150. However, in the example embodiment, the first redistribution substrate 100' may not include the under bump patterns 120 described with reference to FIGS. 1 and 2. The first redistribution substrate 100' may be in direct contact with the semiconductor chip 200 and the molding layer 400. For example, an uppermost first insulating layer 101 may be in direct contact with the bottom surface of the semiconductor chip 200 and a bottom surface of the molding layer 400. The first seed patterns 135 may be provided on top surfaces of the first redistribution patterns 130, respectively. Each of the first seed patterns 135 in the uppermost first insulating layer 101 may be connected directly to the chip pad 230 or the seed pattern 310. The first via portion of each of uppermost first redistribution patterns 130 may vertically overlap with the chip pad 230 or the conductive structure 300.

The first seed pads 155 may be provided on top surfaces of the first redistribution pads 150, respectively. The first redistribution pads 150 may function as pads of the solder balls 500. For example, the solder balls 500 may be provided on bottom surfaces of the first redistribution pads 150, respectively.

The semiconductor package 20 may be manufactured by a chip-first process, but example embodiments of the inventive concepts are not limited thereto.

Figure 8:
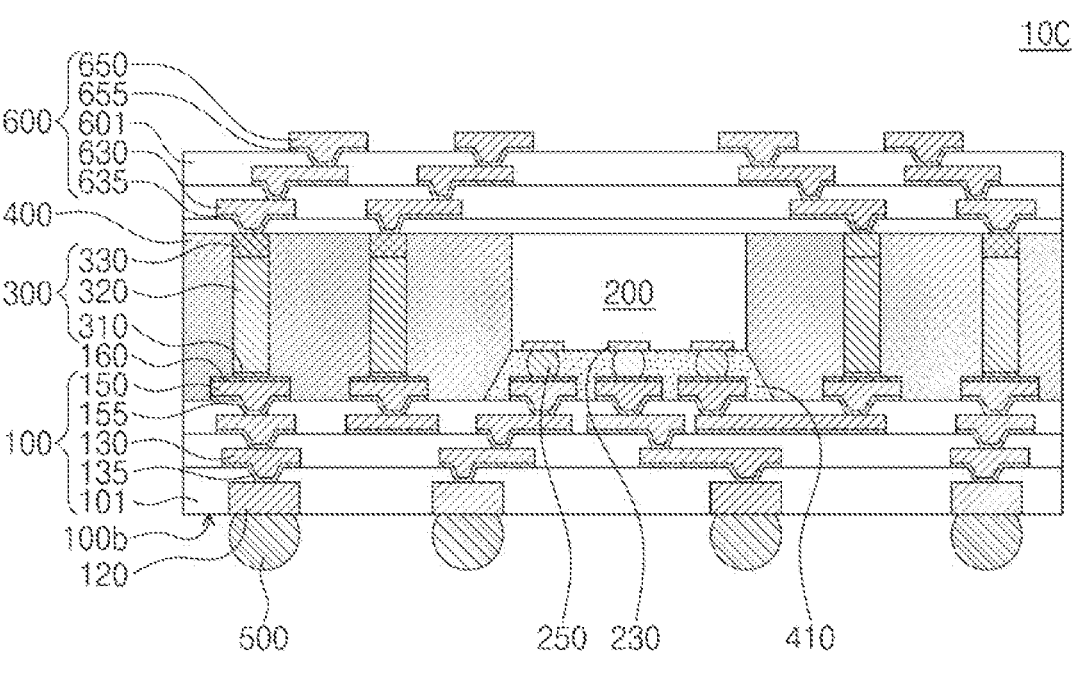
FIG. 8 is a cross-sectional view illustrating a semiconductor package according to example embodiments.
Figure 8:
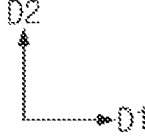

FIG. 8 is a cross-sectional view illustrating a semiconductor package according to example embodiments. Hereinafter, the descriptions to the same technical features as mentioned above with reference to FIGS. 1 and 2 will be omitted and differences between the present example embodiments and the above example embodiments of FIGS. 1 and 2 will be mainly described, for the purpose of ease and convenience in explanation. The same or similar components as in the above example embodiments may be indicated by the same reference numerals or designators.

Referring to FIG. 8, a semiconductor package 10C may include the first redistribution substrate 100, the solder balls 500, the semiconductor chip 200, the conductive structures 300, the molding layer 400, and the second redistribution substrate 600. The semiconductor package 10C may be a lower package.

The molding layer 400 may, the example embodiment, not cover the top surface of the semiconductor chip 200. A top surface of the molding layer 400 may be aligned with the top surface of the semiconductor chip 200 and the top surface of the second conductive structure 330 in the first direction D1. The top surface of the semiconductor chip 200 may be in direct contact with the second redistribution substrate 600. In other words, the bottom surface of the lowermost second insulating layer 601 of the second redistribution substrate 600 may be in contact with the top surface of the semiconductor chip 200.

Figure 9:
FIG. 9 is a cross-sectional view illustrating a semiconductor package according to some example embodiments.

FIG. 9 is a cross-sectional view illustrating a semiconductor package according to example embodiments. Hereinafter, the descriptions to the same technical features as mentioned above with reference to FIGS. 1 and 2 will be omitted and differences between the present example embodiments and the above example embodiments of FIGS. 1 and 2 will be mainly described, for the purpose of ease and convenience in explanation. The same or similar components as in the above example embodiments may be indicated by the same reference numerals or designators.

Referring to FIG. 9, a semiconductor package 1 may include semiconductor package 10 described in the embodiments of FIGS. 1 and 2 serving as a lower package, an upper package 30, and connection solders 800. The semiconductor package 10 serving as a lower package may include the first redistribution substrate 100, the solder balls 500, the semiconductor chip 200, the molding layer 400, the conductive structures 300, and the second redistribution substrate 600. In example embodiments, the lower package may be substantially the same as the semiconductor package 10A of FIGS. 3 and 4 or the semiconductor package of FIGS. 5 and 6.

The upper package 30 may include an upper substrate 700, an upper semiconductor chip 720, and an upper molding layer 740. The upper substrate 700 may be disposed on a top surface of the second redistribution substrate 600 and may be spaced apart from the top surface of the second redistribution substrate 600. The upper substrate 700 may be a printed circuit board (PCB) or a redistribution layer. First metal pads 701 and second metal pads 702 may be disposed on a bottom surface and a top surface of the upper substrate 700, respectively. Metal lines 705 may be provided in the upper substrate 700 so as to be connected to the first metal pads 701 and the second metal pads 702.

The upper semiconductor chip 720 may be mounted on the upper substrate 700. A kind of the upper semiconductor chip 720 may be different from a kind of the semiconductor chip 200. For example, the upper semiconductor chip 720 may be a memory chip, and the semiconductor chip 200 may be a logic chip. Upper bumps 750 may be provided between the upper substrate 700 and the upper semiconductor chip 720. The upper bumps 750 may be connected to the second metal pads 702 and chip pads 730 of the upper semiconductor chip 720, respectively. The upper bumps 750 may include solder balls. Although not shown in the drawings, in example embodiments, the upper bumps 750 may include pillar patterns. The upper semiconductor chip 720 may be connected to the semiconductor chip 200 and/or the solder balls 500 through the second redistribution substrate 600 and the conductive structures 300.

The upper molding layer 740 may be provided on the upper substrate 700 to cover the upper semiconductor chip 720. The upper molding layer 740 may expose a top surface of the upper semiconductor chip 720. In the example embodiment illustrated in FIG. 9, the upper molding layer 740 does not cover the top surface of the upper semiconductor chip 720. However, example embodiments are not limited thereto and the upper molding layer 740 may further cover the top surface of the upper semiconductor chip 720. The upper molding layer 740 may include an insulating polymer such as an epoxy molding compound.

The connection solders 800 may be disposed between the second redistribution substrate 600 and the upper substrate 700 so as to be connected to the second redistribution pads 650 and the first metal pads 701. The connection solders 800 may include a solder material. Even though not shown in the drawings, the connection solders 800 may further include metal pillar patterns, but example embodiments of the inventive concepts are not limited thereto.

The upper package 30 may further include a heat dissipation structure 790. The heat dissipation structure 790 may be disposed on the top surface of the upper semiconductor chip 720 and a top surface of the upper molding layer 740. In example embodiments, the heat dissipation structure 790 may further extend onto a side surface of the upper molding layer 740. The heat dissipation structure 790 may include a heat sink, a heat slug, or a thermal interface material (TIM) layer. For example, the heat dissipation structure 790 may include a metal.

Figure 10:
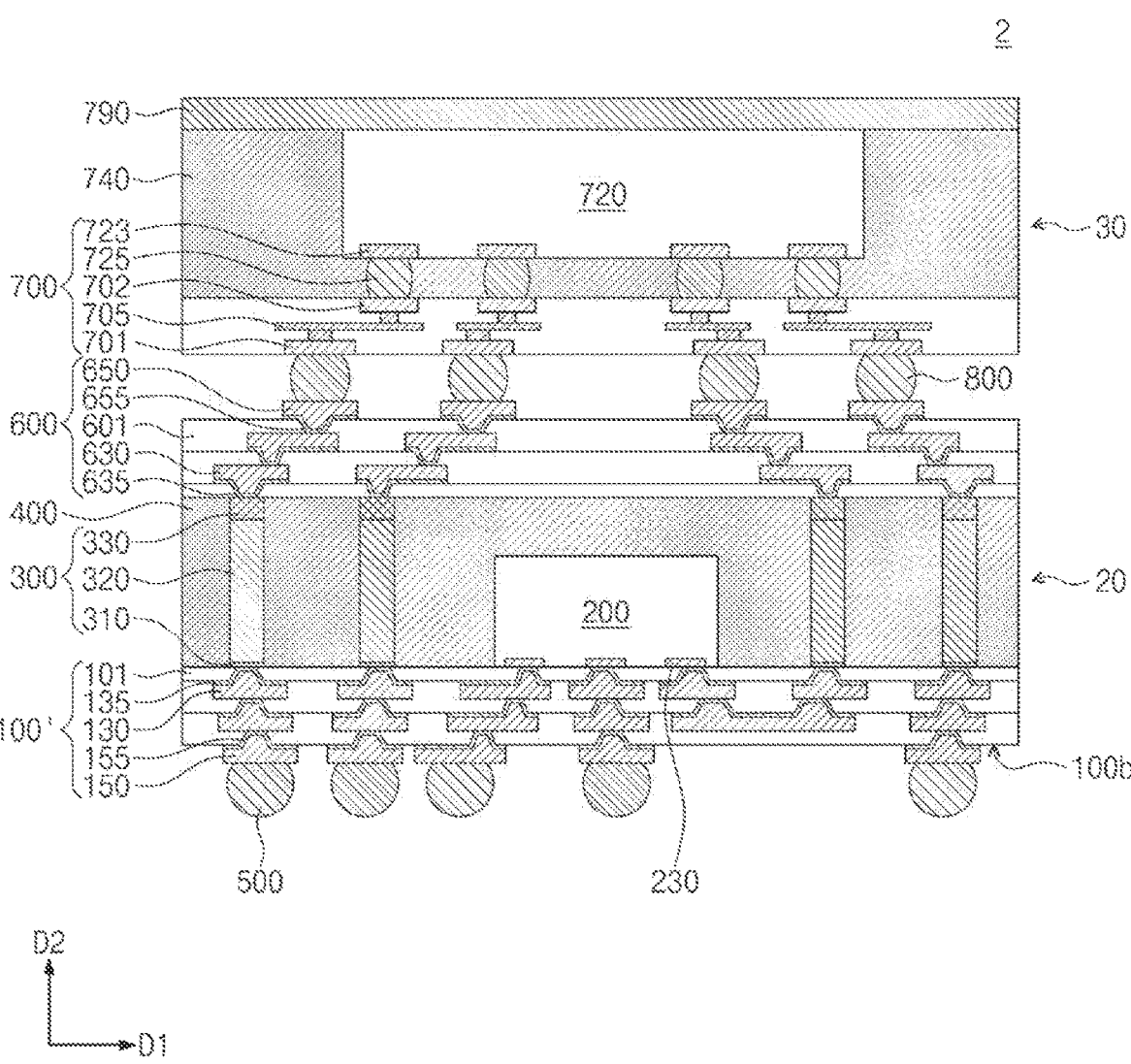
FIG. 10 is a cross-sectional view illustrating a semiconductor package according to example embodiments.

FIG. 10 is a cross-sectional view illustrating a semiconductor package according to example embodiments. Hereinafter, the descriptions to the same technical features as mentioned above with reference to FIG. 9 will be omitted and differences between the present example embodiments and the above example embodiments of FIG. 9 will be mainly described, for the purpose of ease and convenience in explanation. The same or similar components as in the above example embodiments may be indicated by the same reference numerals or designators.

Referring to FIG. 10, a semiconductor package 2 may include semiconductor package 20 described in the example embodiments of FIG. 7 serving as a lower package, the upper package 30, and the connection solders 800. The semiconductor package 20 serving as a lower package may include the first redistribution substrate 100, the solder balls 500, the semiconductor chip 200, the molding layer 400, the conductive structures 300, and the second redistribution substrate 600. However, the semiconductor package 2 may not include the bumps 250 and the underfill layer 410 of FIG. 9.

FIGS. 11 to 24 are cross-sectional views illustrating a method of manufacturing a semiconductor package according to example embodiments. Hereinafter, the descriptions to the same technical features as mentioned above will be omitted for the purpose of ease and convenience in explanation.

Figure 11:
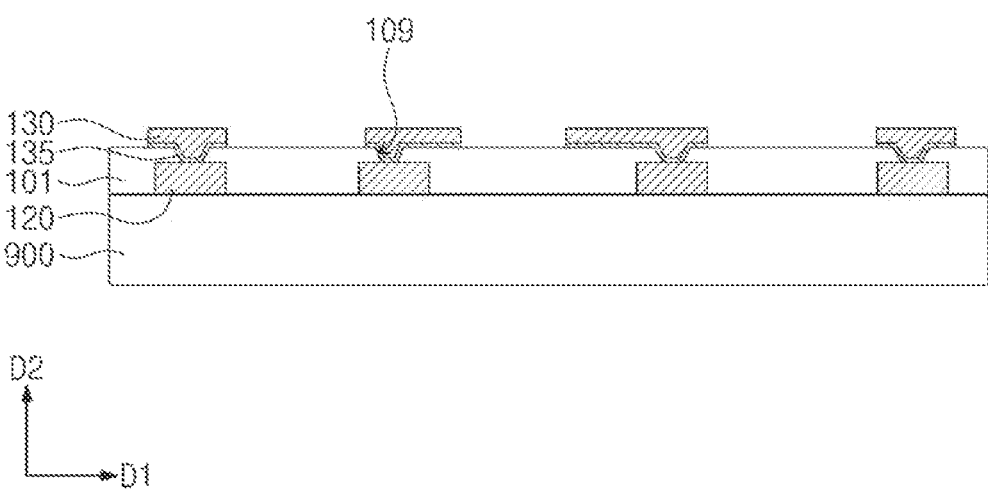
FIGS. 11 to 24 are cross-sectional views illustrating a method of manufacturing a semiconductor package according to example embodiments.

Referring to FIG. 11, under bump patterns 120, a first insulating layer 101, first seed patterns 135 and first redistribution patterns 130 may be formed on a carrier substrate 900.

In some example embodiments, the under bump patterns 120 may be formed on the carrier substrate 900 by an electroplating process. The first insulating layer 101 may be formed on the carrier substrate 900 to cover side surfaces and top surfaces of the under bump patterns 120. First openings 109 may be formed in the first insulating layer 101 to expose the under bump patterns 120.

The formation of the first seed patterns 135 and the first redistribution patterns 130 may include forming a first seed layer (not shown) in the first openings 109 and on a top surface of the first insulating layer 101, forming a resist pattern (not shown) on the first seed layer, performing an electroplating process using the first seed layer as an electrode, removing the resist pattern to expose a portion of the first seed layer, and etching the exposed portion of the first seed layer.

The first redistribution patterns 130 may be formed in the first openings 109 and a lower portion of the resist pattern by the electroplating process. Each of the first redistribution patterns 130 may include a first via portion and a first interconnection portion. The first via portion may be formed in a corresponding first opening 109, and the first interconnection portion may be formed on the first via portion and the first insulating layer 101. By the etching of the first seed layer, the first seed patterns 135 may be formed on bottom surfaces of the first redistribution patterns 130, respectively.

Figure 12:
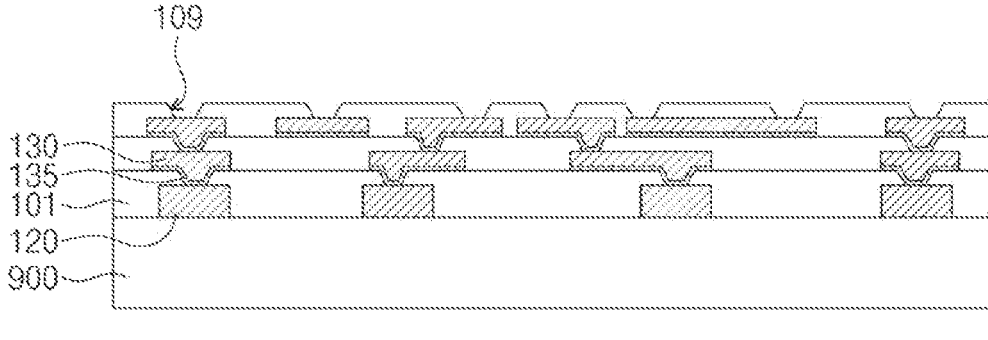
Figure 12:
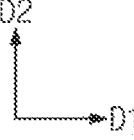

Referring to FIG. 12, the process of forming the first insulating layer 101, the process of forming the first seed patterns 135 and the process of forming the first redistribution patterns 130 may be repeatedly performed. Thus, stacked first insulating layers 101 and stacked first redistribution patterns 130 may be formed. After formation of an uppermost first insulating layer 101, first openings 109 may be formed in the uppermost first insulating layer 101 to expose the first redistribution patterns 130.

Figure 13:
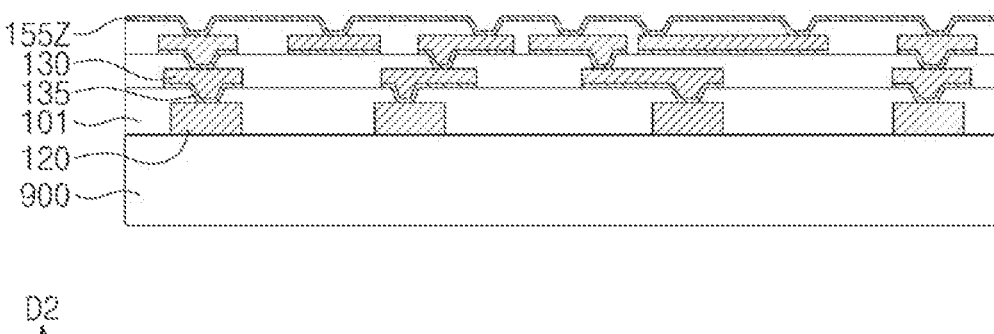

Referring to FIG. 13, a first seed pad layer 155Z may be formed on a top surface of the uppermost first insulating layer 101 and in the first openings 109. The first seed pad layer 155Z may completely cover the top surface of the uppermost first insulating layer 101 and the exposed portions of the first redistribution patterns 130.

Figure 14:
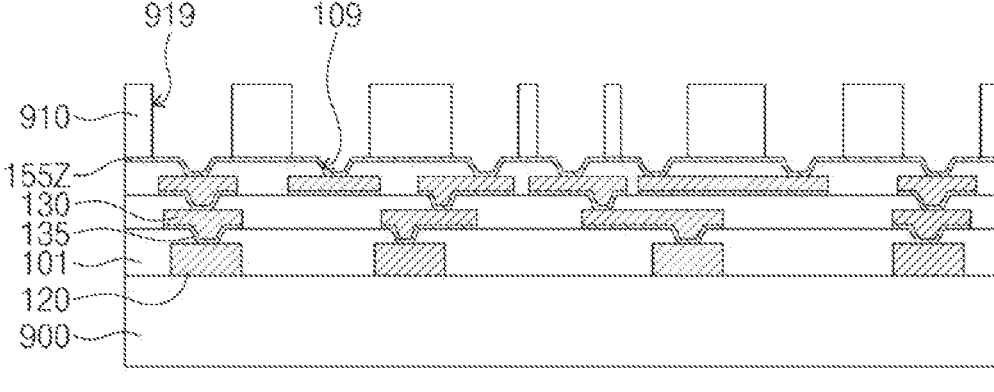
Figure 14:
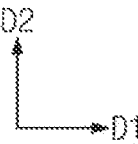

Referring to FIG. 14, a first resist pattern 910 may be formed on a top surface of the first seed pad layer 155Z. The first resist pattern 910 may include a photoresist material. The first resist pattern 910 may be patterned by exposure and development processes. Second openings 919 may be formed in the first resist pattern 910. The second openings 919 may expose the first seed pad layer 155Z.

Figure 15:
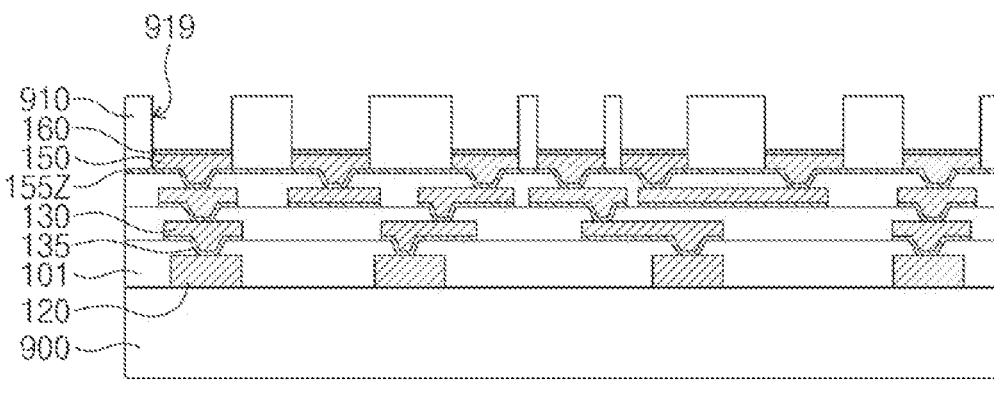
Figure 15:
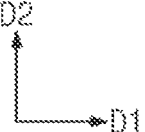

Referring to FIG. 15, first redistribution pads 150 may be formed in the second openings 919, respectively, and may be connected to the first redistribution patterns 130. The formation of the first redistribution pads 150 may be performed by an electroplating process using the first seed pad layer 155Z as an electrode. Thus, a first redistribution substrate 100 may be manufactured.

Bonding pads 160 may be formed on the first redistribution pads 150. The bonding pads 160 may be formed in the second openings 919. The first resist pattern 910 may be removed after the formation of the bonding pads 160.

Figure 16:
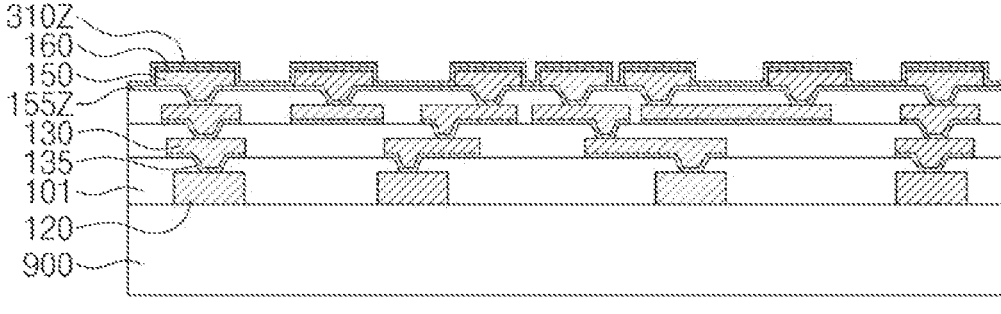
Figure 16:
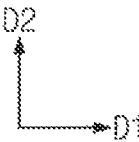

Referring to FIG. 16, a conductive seed layer 310Z may be formed on a top surface of the first redistribution substrate 100 to cover the bonding pads 160 and the first seed pad layer 155Z. For example, the conductive seed layer 310Z may cover side surfaces and top surfaces of the bonding pads 160, side surfaces of the first redistribution pads 150, and the top surface of the first seed pad layer 155Z on the uppermost first insulating layer 101.

Figure 17:
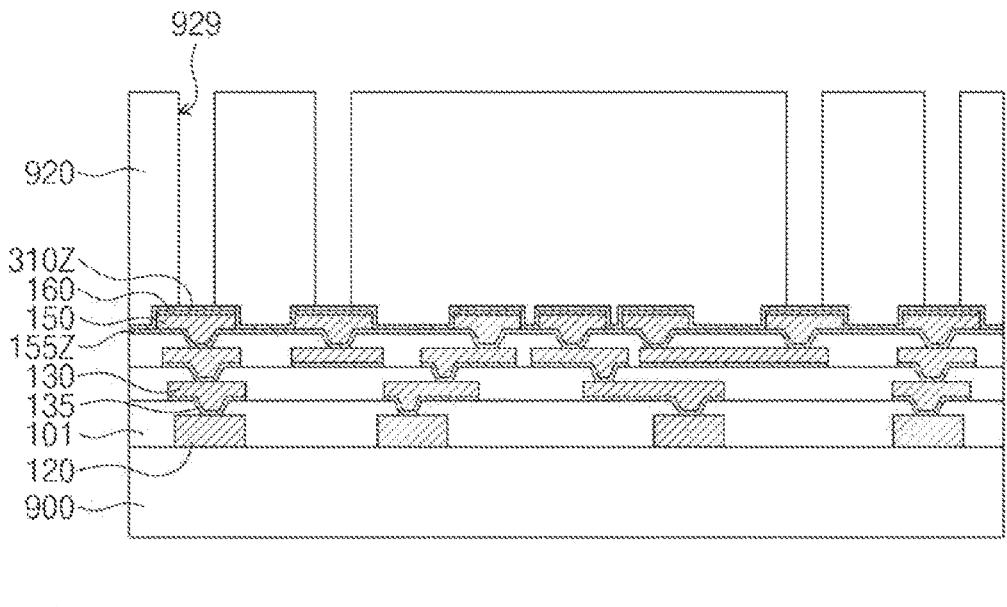
Figure 17:
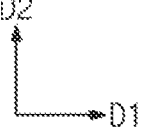

Referring to FIG. 17, a second resist pattern 920 may be formed on a top surface of the conductive seed layer 310Z. The second resist pattern 920 may include a photoresist material. The second resist pattern 920 may be patterned by exposure and development processes. Third openings 929 may be formed in the second resist pattern 920. The third openings 929 may expose the conductive seed layer 310Z. Each of the third openings 929 may have a uniform width. For example, a width of an upper portion of each of the third openings 929 may be substantially equal to a width of a lower portion of each of the third openings 929.

Figure 18:
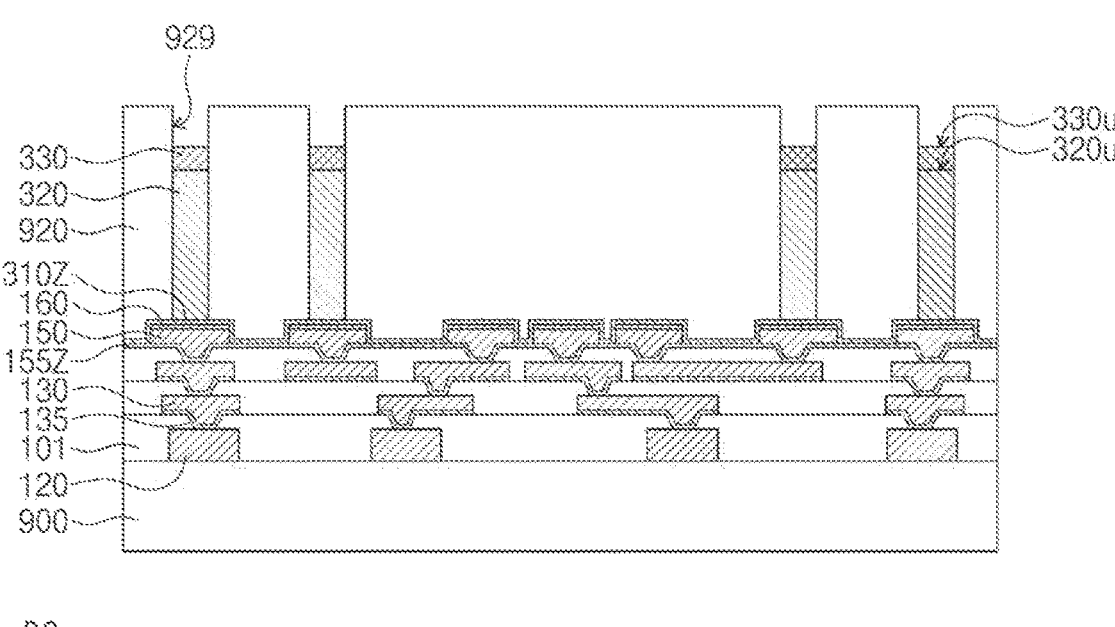

Referring to FIG. 18, first conductive structures 320 may be formed in the third openings 929 and on the conductive seed layer 310Z. The formation of the first conductive structures 320 may include performing an electroplating process using the conductive seed layer 310Z as an electrode. A top surface 320u of each of the first conductive structures 320 may be located at a lower level than a top surface of the second resist pattern 920. The electroplating process may be finished before the first conductive structures 320 extend onto the top surface of the second resist pattern 920. The top surfaces 320u of the first conductive structures 320 may have flat shapes, dome shapes, or dishing shapes, depending on the growth of the first conductive structures 320 by the electroplating process. Each of these shapes may correspond to that of the first conductive structure 320 of the semiconductor package described with reference to FIGS. 1 and 2, FIGS. 3 and 4, or FIGS. 5 and 6.

Second conductive structures 330 may be formed in the third openings 929 and on the first conductive structures 320. The formation of the second conductive structures 330 may include performing an electroplating process. A top surface 330u of each of the second conductive structures 330 may be located at a lower level than the top surface of the second resist pattern 920. The electroplating process may be finished before the second conductive structures 330 extend onto the top surface of the second resist pattern 920.

Figure 19:
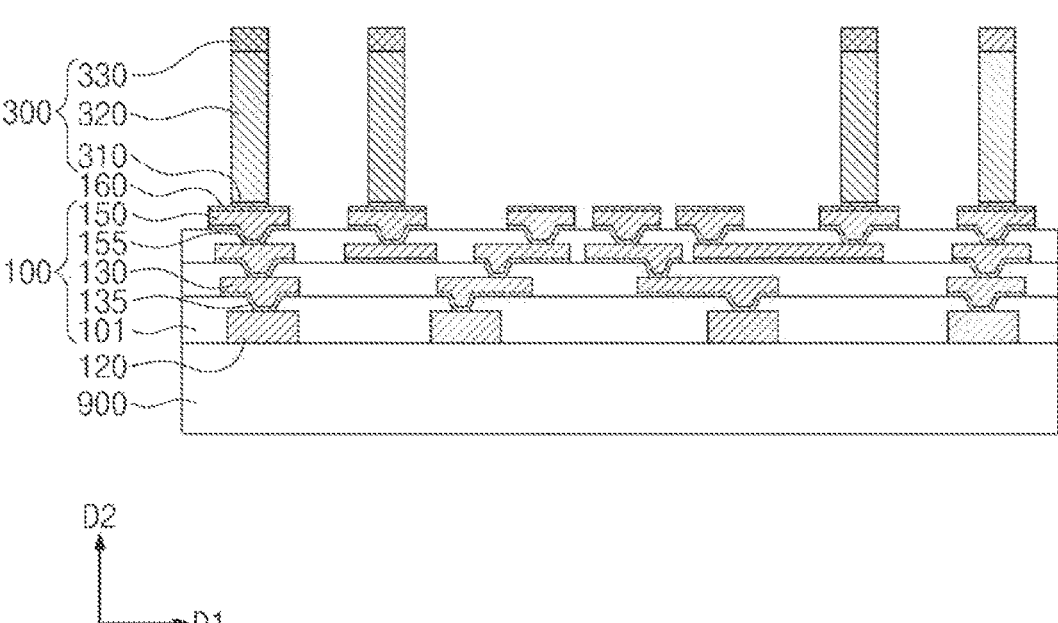

Referring to FIG. 19, the second resist pattern 920 may be removed. Seed patterns 310 and first seed pads 155 may be formed after the removal of the second resist pattern 920. The formation of the seed patterns 310 may include etching the conductive seed layer 310Z. The formation of the first seed pads 155 may include etching the first seed pad layer 155Z. Thus, a conductive structure 300 may be manufactured.

Figure 20:
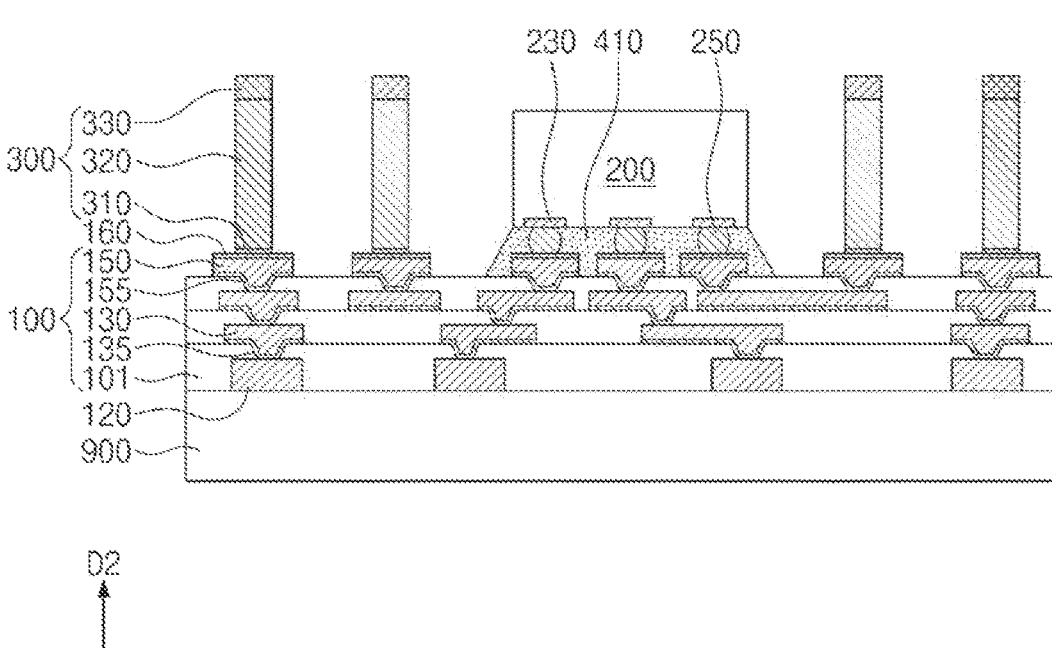

Referring to FIG. 20, a semiconductor chip 200 may be mounted on the top surface of the first redistribution substrate 100. The mounting of the semiconductor chip 200 may include forming bumps 250 between the first redistribution substrate 100 and the semiconductor chip 200. The bumps 250 may be connected to the first redistribution pads 150 and chip pads 230 of the semiconductor chip 200. An underfill layer 410 may be formed between the first redistribution substrate 100 and the semiconductor chip 200.

Figure 21:
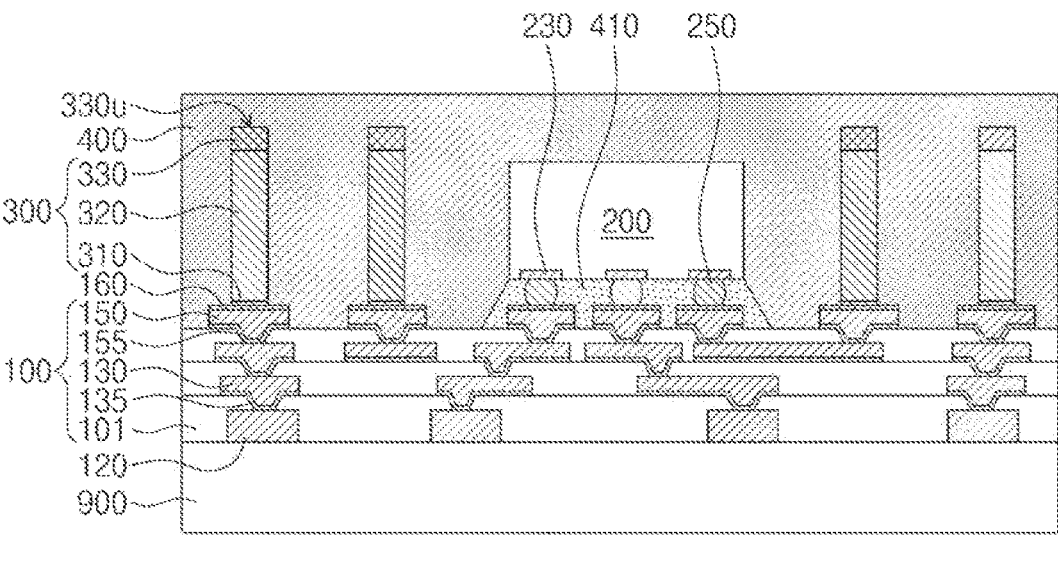
Figure 21:
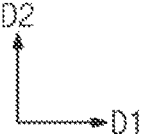

Referring to FIG. 21, a molding layer 400 may be formed on the top surface of the first redistribution substrate 100 to cover the semiconductor chip 200 and the conductive structures 300. A top surface of the molding layer 400 may be located at a higher level than a top surface of the semiconductor chip 200 and the top surface 330u of the second conductive structure 330.

Figure 22:
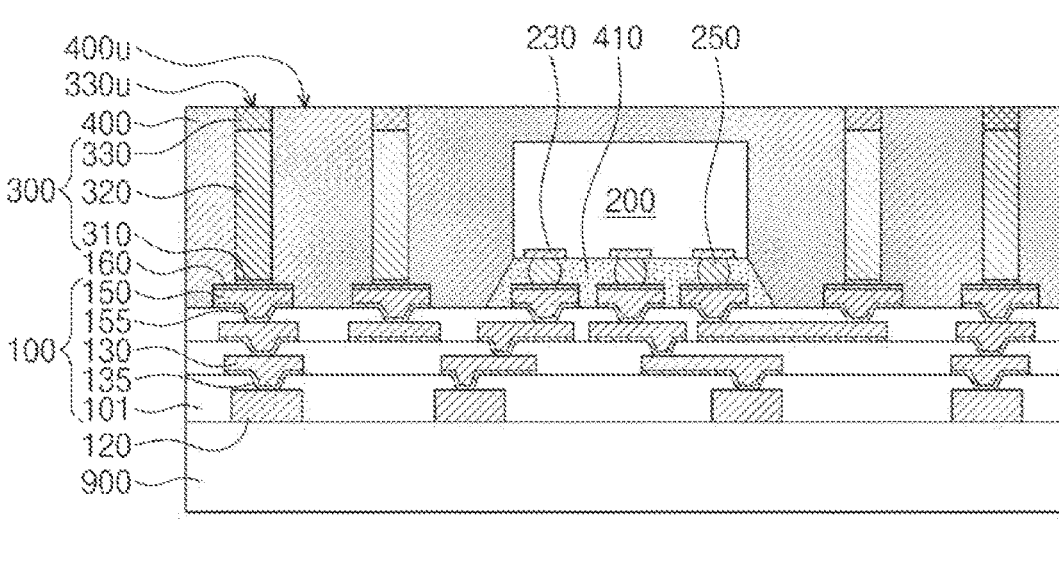
Figure 22:
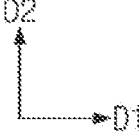

Referring to FIG. 22, a grinding process may be performed on the molding layer 400 to expose the second conductive structures 330. For example, the grinding process may be performed by a chemical mechanical polishing (CMP) process. After the top surfaces 330u of the second conductive structures 330 are exposed, the grinding process may further be performed on the exposed second conductive structures 330. Thus, a portion of each of the second conductive structures 330 may further be removed. The ground top surfaces 330u of the second conductive structures 330 may be flat. A top surface 400u of the molding layer 400 may be coplanar with the ground top surfaces 330u of the conductive structures 300. For example, the grinding process may be finished before the top surface of the semiconductor chip 200 is exposed. The molding layer 400 may cover the top surface of the semiconductor chip 200.

Figure 23:
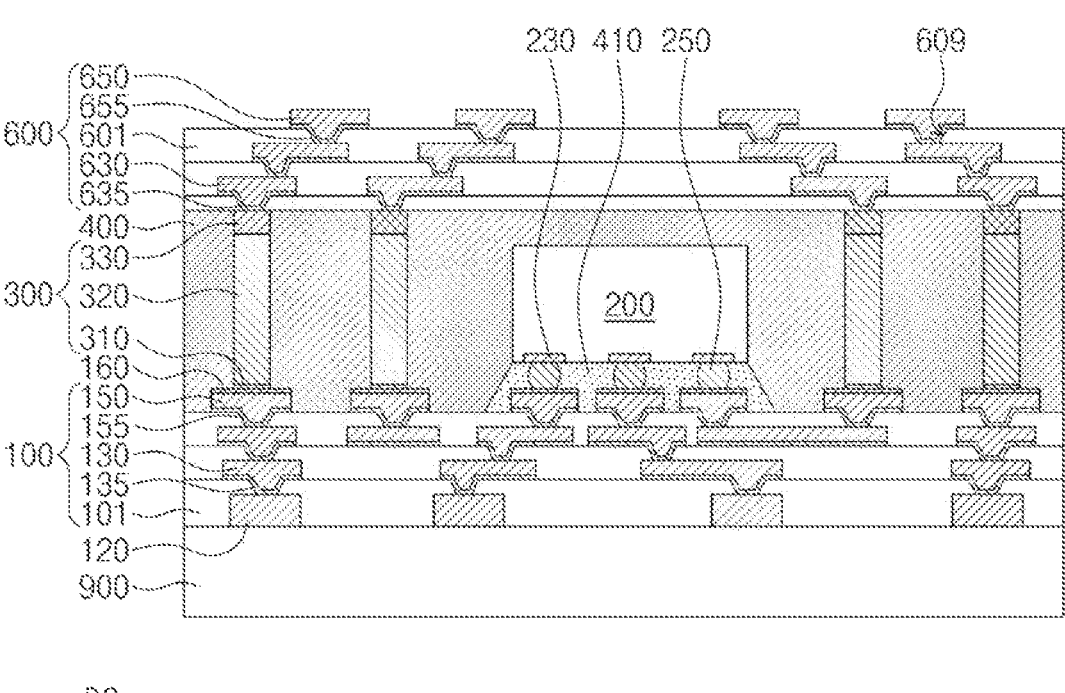
Figure 23:
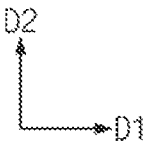

Referring to FIG. 23, a second redistribution substrate 600 may be formed on the molding layer 400 and the conductive structures 300. In some example embodiments, a second insulating layer 601 may be formed on the top surface of the molding layer 400. The second insulating layer 601 may cover at least a portion of the top surface 330u of each of the second conductive structures 330. Fourth openings 609 may be formed in the second insulating layer 601 to expose the top surfaces 330u of the second conductive structures 330.

Second seed patterns 635 may be conformally formed in the fourth openings 609 and on a top surface of the second insulating layer 601. Second redistribution patterns 630 may be formed in the fourth openings 609 and on the top surface of the second insulating layer 601 to cover the second seed patterns 635.

Each of the second redistribution patterns 630 may include a second via portion and a second interconnection portion. The second via portion may be formed in a corresponding fourth opening 609. The second interconnection portion may be formed on the second via portion and may extend onto the top surface of the second insulating layer 601. A method of forming the second seed patterns 635 and the second redistribution patterns 630 may be the same or similar as the method of forming the first redistribution patterns 130 and the first seed patterns 135 of FIG. 11. The process of forming the second insulating layer 601, the process of forming the second seed patterns 635 and the process of forming the second redistribution patterns 630 may be repeatedly performed. Thus, a plurality of stacked second insulating layers 601, a plurality of stacked second seed patterns 635 and a plurality of stacked second redistribution patterns 630 may be formed.

Second redistribution pads 650 may be formed in an uppermost second insulating layer 601 and on a top surface of the uppermost second insulating layer 601. Second seed pads 655 may be formed before the formation of the second redistribution pads 650. The second redistribution pads 650 may be formed by an electroplating process using the second seed pads 655 as an electrode. Thus, a second redistribution substrate 600 may be manufactured. The second redistribution substrate 600 may include the second insulating layers 601, the second seed patterns 635, the second redistribution patterns 630, the second seed pads 655, and the second redistribution pads 650.

Figure 24:
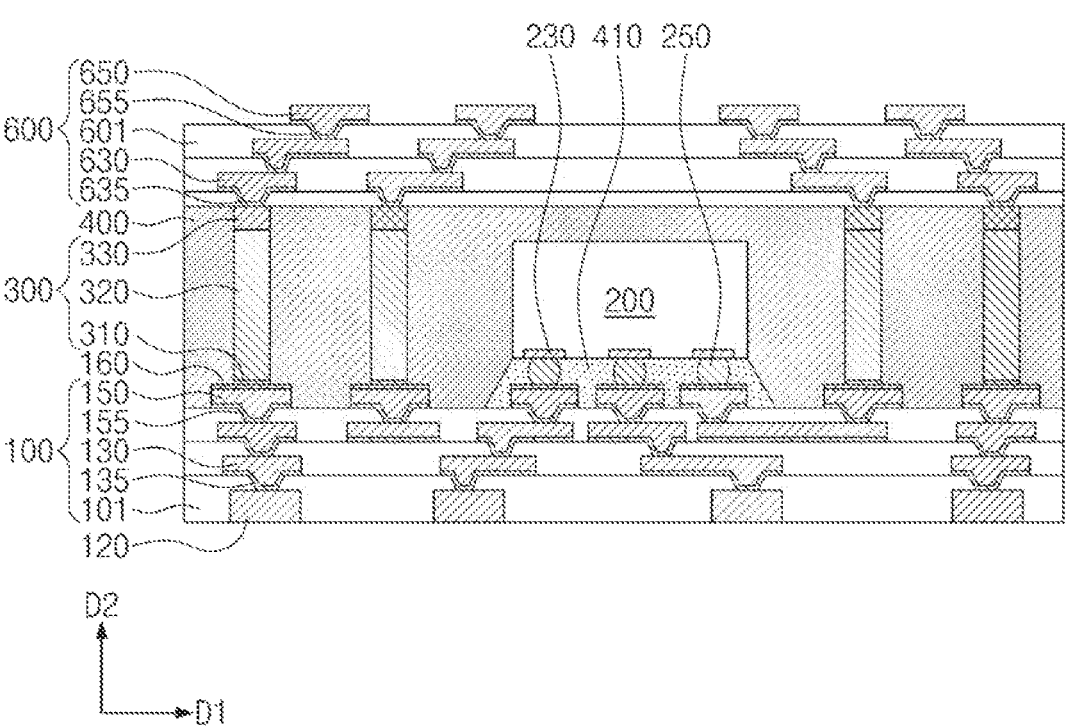

Referring to FIG. 24, the carrier substrate 900 may be removed to expose a bottom surface of the first redistribution substrate 100. For example, a bottom surface of a lowermost first insulating layer 101 and bottom surfaces of the under bump patterns 120 may be exposed.

Referring again to FIG. 1, solder balls 500 may be formed on the bottom surfaces of the under bump patterns 120, respectively, and may be connected to the under bump patterns 120, respectively. The semiconductor package 10 may be manufactured by the processes described in the above embodiments.

Since the second conductive structures 330 are formed immediately after the formation of the first conductive structures 320, an additional wet etching process/an additional bake process may not be performed after the formation of the first conductive structures 320. Thus, it is possible to provide the method of manufacturing a semiconductor package, which is capable of improving efficiency and of simplifying processes.

According to example embodiments, the second conductive structures including nickel (Ni) may be provided on the first conductive structures, and thus the first conductive structures may not be in contact with the second insulating layer of the second redistribution substrate. Thus, it is possible to prevent reaction between the second insulating layer and the first conductive structures, and it is possible to prevent a crack from occurring at connection portions of the second redistribution substrate and the conductive structures. As a result, the semiconductor package with improved durability and reliability may be provided.

According to example embodiments, the second conductive structure may be formed immediately after the formation of the first conductive structure when the semiconductor package is manufactured, and thus an additional wet etching process/an additional bake process may not be performed. As a result, it is possible to provide the method of manufacturing a semiconductor package, which is capable of improving efficiency and of simplifying processes.

While example embodiments have been particularly shown and described, it will be understood that various changes in form and detail may be made therein without departing from the spirit and scope of the following claims.

What is claimed is:

1. A semiconductor package comprising:
a first redistribution substrate;
a semiconductor chip on a top surface of the first redistribution substrate;
a conductive structure on the top surface of the first redistribution substrate and spaced apart from the semiconductor chip;
a molding layer on the first redistribution substrate and on a side surface of the semiconductor chip and a side surface of the conductive structure; and
a second redistribution substrate on the molding layer and the conductive structure,
wherein the conductive structure comprises:
a first conductive structure on the first redistribution substrate; and
a second conductive structure on a top surface of the first conductive structure and including nickel,
wherein the second redistribution substrate comprises an insulating layer, and
wherein the insulating layer directly contacts at least a portion of a top surface of the second conductive structure and at least a portion of a top surface of the molding layer.

2. The semiconductor package of claim 1, wherein the top surface of the molding layer is coplanar with the top surface of the second conductive structure.

3. The semiconductor package of claim 1, wherein the second conductive structure directly contacts the first conductive structure, and
wherein the second conductive structure is on the top surface of the first conductive structure.

4. The semiconductor package of claim 1, wherein the first conductive structure overlaps the second conductive structure when viewed in a plan view.

5. The semiconductor package of claim 1, wherein the first conductive structure has a first height and the second conductive structure has a second height that is less than the first height.

6. The semiconductor package of claim 5, wherein the second height is in a range from 10 μm to 30 μm.

7. The semiconductor package of claim 1, wherein a width of the first conductive structure is substantially equal to a width of the second conductive structure.

8. The semiconductor package of claim 1, further comprising:

a seed pattern between the first conductive structure and the first redistribution substrate.

9. The semiconductor package of claim 8, wherein a width of the seed pattern is substantially equal to a width of the first conductive structure.

10. The semiconductor package of claim 1, further comprising:

bumps between the first redistribution substrate and the semiconductor chip, wherein the first redistribution substrate is electrically connected to the semiconductor chip through the bumps.

11. The semiconductor package of claim 1, wherein the top surface of the first conductive structure has a shape which is convex or concave with respect to the top surface of the first redistribution substrate.

12. A semiconductor package comprising:

a first redistribution substrate;

a semiconductor chip on a top surface of the first redistribution substrate;

a conductive structure on the top surface of the first redistribution substrate and spaced apart from the semiconductor chip;

a molding layer on the first redistribution substrate and on a side surface of the semiconductor chip and a side surface of the conductive structure; and a second redistribution substrate on the molding layer and the conductive structure and connected to the conductive structure, wherein the conductive structure comprises:

a first conductive structure connected to the first redistribution substrate; and a second conductive structure on the first conductive structure, wherein the second conductive structure includes nickel, wherein a top surface of the second conductive structure is coplanar with a top surface of the molding layer, wherein the second redistribution substrate comprises an insulating layer, and wherein the insulating layer directly contacts at least a portion of the top surface of the second conductive structure and at least a portion of the top surface of the molding layer.

13. The semiconductor package of claim 12, wherein the first conductive structure has a first height and the second conductive structure has a second height that is less than the first height, and wherein the second height is in a range from 10 μm to 30 μm.

14. The semiconductor package of claim 12, further comprising:

a bonding pad between the first redistribution substrate and the conductive structure, wherein the bonding pad comprises gold (Au).

15. The semiconductor package of claim 12, wherein the second conductive structure directly contacts the first conductive structure, and wherein the second conductive structure is on a top surface of the first conductive structure.

16. The semiconductor package of claim 12, further comprising:

an upper semiconductor chip on a top surface of the second redistribution substrate.

17. A semiconductor package comprising:

a first redistribution substrate comprising a first insulating layer and a first redistribution pattern;

a solder ball on a bottom surface of the first redistribution substrate;

a semiconductor chip on a top surface of the first redistribution substrate;

a conductive structure on the first redistribution substrate and laterally spaced apart from the semiconductor chip;

a seed pattern disposed between the first redistribution substrate and the conductive structure;

a molding layer on the first redistribution substrate and on the semiconductor chip, the molding layer on a side surface of the conductive structure and exposing a top surface of the conductive structure; and a second redistribution substrate on the molding layer and connected to the conductive structure, wherein the second redistribution substrate comprises a second insulating layer and a second redistribution pattern, wherein the conductive structure comprises:

a first conductive structure on the top surface of the first redistribution substrate; and a second conductive structure on a top surface of the first conductive structure, wherein the second insulating layer comprises a photo-sensitive polymer, wherein the second conductive structure comprises nickel (Ni), and wherein the second insulating layer directly contacts at least a portion of a top surface of the second conductive structure and at least a portion of a top surface of the molding layer.

18. The semiconductor package of claim 17, further comprising:

a bonding pad disposed between the first redistribution pattern and the first conductive structure, wherein the bonding pad comprises gold (Au).

19. The semiconductor package of claim 17, wherein a width of the first conductive structure is substantially equal to a width of the second conductive structure, and wherein a height of the first conductive structure is greater than a height of the second conductive structure.

* * * * *